United States Patent
Akaishi et al.

(10) Patent No.: US 9,698,328 B2
(45) Date of Patent: Jul. 4, 2017

(54) LIGHT EMITTING DEVICE

(71) Applicant: NICHIA CORPORATION, Anan-shi (JP)

(72) Inventors: Takanori Akaishi, Tokushima (JP); Kensaku Hamada, Komatsushima (JP); Saiki Yamamoto, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/927,471

(22) Filed: Oct. 30, 2015

(65) Prior Publication Data

US 2016/0126435 A1    May 5, 2016

(30) Foreign Application Priority Data

Oct. 31, 2014 (JP) .................................. 2014-222130

(51) Int. Cl.
*H01L 33/62* (2010.01)
*H01L 23/00* (2006.01)

(52) U.S. Cl.
CPC .............. *H01L 33/62* (2013.01); *H01L 24/48* (2013.01); *H01L 2224/45144* (2013.01);
(Continued)

(58) Field of Classification Search
CPC ........ H01L 33/50–33/504; H01L 33/52; H01L 33/56; H01L 33/62;
(Continued)

(56) References Cited

U.S. PATENT DOCUMENTS

2008/0265271 A1* 10/2008 Biar ........................ H01L 24/97
257/99
2011/0006334 A1    1/2011 Ishii et al.
(Continued)

FOREIGN PATENT DOCUMENTS

| JP | 2010-045105 | 2/2010 |
| JP | 2013-179273 | 9/2013 |
| WO | WO 2009/107535 | 9/2009 |

OTHER PUBLICATIONS

Tsai et al., 'An innovative annealing-twinned Ag—Au—Pd bonding wire for IC and LED Packaging,' 2012 7th International Microsystems, Packaging, Assembly, and Circuits Technology Conference, pp. 243-246.*

*Primary Examiner* — Bryan Junge
(74) *Attorney, Agent, or Firm* — Mori & Ward, LLP

(57) ABSTRACT

A light emitting device includes an electrically conductive member, a light emitting element, a wire, and a sealing member. The wire contains gold and silver and connects the electrically conductive member and the light emitting element. The wire includes a ball portion and a recrystallized region. The ball portion is provided on an electrode of the light emitting element. The recrystallized region is provided on the ball portion and has a length in a range of 50 μm to 90 μm. The sealing member has a lower surface and an upper surface opposite to the lower surface and covers the light emitting element and the wire so that the lower surface faces the electrically conductive member and the light emitting element and so that a distance from a top of the ball portion to the upper surface of the sealing member is 90 μm to 230 μm.

9 Claims, 3 Drawing Sheets

(52) U.S. Cl.
CPC ............ *H01L 2224/48095* (2013.01); *H01L 2224/48137* (2013.01); *H01L 2224/48247* (2013.01); *H01L 2224/48257* (2013.01); *H01L 2224/48465* (2013.01); *H01L 2933/0066* (2013.01)

(58) Field of Classification Search
CPC ............ H01L 2224/4845–2224/48453; H01L 2224/48463
See application file for complete search history.

(56) References Cited

U.S. PATENT DOCUMENTS

| | | | | |
|---|---|---|---|---|
| 2011/0316032 | A1* | 12/2011 | Ooyabu | H01L 33/505 257/98 |
| 2012/0153444 | A1* | 6/2012 | Haga | H01L 23/4334 257/666 |
| 2013/0171470 | A1* | 7/2013 | Lee | C22F 1/14 428/672 |
| 2013/0193460 | A1* | 8/2013 | Kanada | H01L 33/62 257/88 |
| 2014/0291706 | A1* | 10/2014 | Lin | H01L 33/52 257/88 |
| 2015/0124420 | A1* | 5/2015 | Heinrich | H05K 1/11 361/767 |

\* cited by examiner

LIGHT EMITTING DEVICE

CROSS-REFERENCE TO RELATED APPLICATIONS

The present application claims priority under 35 U. S. C. §119 to Japanese Patent Application No. 2014-222130, filed Oct. 31, 2014. The contents of this application are incorporated herein by reference in their entirety.

BACKGROUND

1. Technical Field

The present disclosure relates to a light emitting device.

2. Description of the Related Art

There are known light emitting devices such as a light emitting diode (LED) in which a semiconductor light emitting element (hereinafter may also be referred to as a "light emitting element") is mounted on a package provided with an electrically conductive member. The light emitting element is electrically connected to the electrically conductive member of the package via a wire, for example. As the material of the wire, gold (Au) excellent in ductility is often used. In order to further increase the output, it has been proposed the use of a gold-silver alloy wire containing silver (Ag) that has higher reflectivity than a gold wire (for example, JP 2013-179273 A).

However, a gold-silver alloy wire is lower in ductility than a gold wire. Accordingly, depending on the type of members used for the light emitting device, the size of the light emitting device and the like, a gold-silver alloy wire tends to easily break.

SUMMARY OF THE INVENTION

According to one aspect of the present invention, a light emitting device includes an electrically conductive member, a light emitting element, a wire, and a sealing member. The light emitting element is provided on the electrically conductive member and has an electrode. The wire contains gold and silver and connects the electrically conductive member and the light emitting element. The wire includes a ball portion and a recrystallized region. The ball portion is provided on the electrode of the light emitting element. The recrystallized region is provided on the ball portion and has a length in a range of 50 µm to 90 µm. The sealing member has a lower surface and an upper surface opposite to the lower surface and covers the light emitting element and the wire so that the lower surface faces the electrically conductive member and the light emitting element and so that a distance from a top of the ball portion to the upper surface of the sealing member is 90 µm to 230 µm.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION OF THE EMBODIMENTS

Figure 1A:
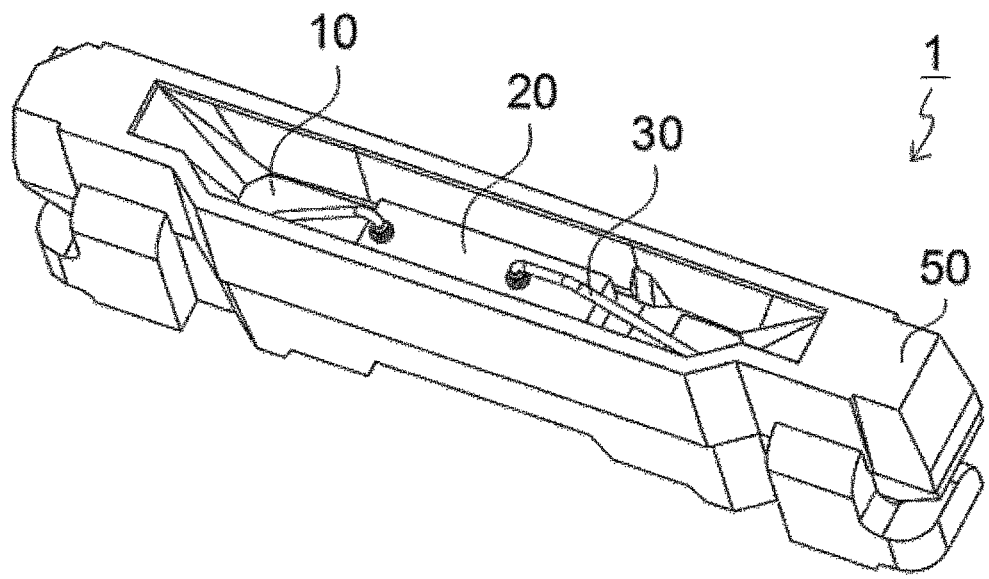
FIG. 1A is a schematic perspective view showing a light emitting device according to one embodiment.

The embodiments will now be described with reference to the accompanying drawings, wherein like reference numerals designate corresponding or identical elements throughout the various drawings.

In the following, with reference to the drawings, embodiments for carrying out the present disclosure are described. The embodiments shown below are for illustrative purposes of a light emitting device for embodying the technical idea of the present disclosure, and the present disclosure is not intended to limit a light emitting device to the following.

Further, the present specification is not intended to limit members recited in the claims to members appearing in the embodiments. In particular, the dimension, material, shape, relative arrangement and the like of constituent elements appearing in the embodiments are provided merely for illustrative purpose, and not intended to limit the scope of the present disclosure thereto unless otherwise specified. Note that, the size or positional relationship of members shown in the drawings may be exaggerated for the sake of clarity. Further, in the following description, identical names and reference characters denote identical or similar members, and a detailed description thereof will be omitted as appropriate.

In the embodiments of the present invention, a light emitting device includes an electrically conductive member, a light emitting element, a wire and a sealing member.

Electrically Conductive Member

The electrically conductive member is made of a plate-like metal member formed in a predetermined shape. The electrically conductive member includes a metal plate which is a base material, and plating formed on an upper surface of the metal plate.

The metal plate is formed in a predetermined pattern by using a processing method such as etching, pressing, punching, blasting or the like. A plurality of the same patterns are formed to produce the electrically conductive members for a plurality of light emitting devices from a single metal plate (lead frame). Each pattern includes a pair of positive and negative lead portions that serve as electrode terminals and portions that serves as heat dissipation members in a light emitting device, and further, also includes a connection portion for connecting the pattern to other pattern, and the like. Further, each pattern may include a notch, a recess, a hole and the like. Such processing can be performed before formation of a plating, which will be described later, or after formation of the plating, but the processing is preferably performed before formation of the plating.

The material of the metal plate may be, for example, metal such as Fe, Ni, Co, Ti, Sc, Nb, Zn, Zr, W, Mo, Ta, Cu, Al, Au, Pt, Ag, Rh, Ru, Pd, Os, Ir, Hf, V, Mn, Cr, La, Y, Sn or the like, or an alloy of such metals. They may be a single layer, or may have a stacked-layer structure (for example, a clad material). It is preferable to use Fe, Ni, or Cu as the main component. Further, nonmetal such as Si or P may be contained as a trace element.

The thickness of the metal plate is, for example, preferably about 60 µm to about 1000 µm, and further preferably about 100 µm to about 500 µm.

Preferably, a plating is formed on an upper surface of the metal plate. The plating preferably has a thickness of about 2 µm to about 10 µm. The material of the plating may be Au (gold), Cu (copper), Pt, Pd, Al, W, Mo, Ru, Rh, Ni, Ag or the like. They may be used singly (as a single layer), or in a structure in which a plurality of such elements are stacked. Such a stacked-layer structure may be, for example, Cu/Ni/Pd/Au/Ag in order from the upper surface of the metal plate, and particularly Cu/Ag is preferable.

Note that, the plating is not necessarily formed on the entire upper surface of the metal plate, and the metal plate may be partially exposed. As described above, the plating whose topmost surface is silver is preferably formed at a region irradiated with light from the light emitting element, for example, at the surface on which the light emitting element is placed. Further, it is not essential to provide such a plating to a region not irradiated with light from the light emitting element, for example, the surface on which a solder is bonded when the light emitting device is mounted.

Light Emitting Element

The light emitting element includes a semiconductor layer having a light emitting layer to emit light by being energized, and electrodes for energizing the semiconductor layer.

The semiconductor layer includes an element substrate and a stacked-layer body including the light emitting layer and stacked on the element substrate. Alternatively, the semiconductor layer may be a semiconductor stacked-layer body without the element substrate, that is obtained by stacking the stacked-layer body including the light emitting layer on the element substrate, and then, removing the element substrate.

The stacked-layer body stacked on the element substrate may be formed as follows, for example. On the element substrate, a first semiconductor layer (an n-type or a p-type semiconductor layer), the light emitting layer, and a second semiconductor layer (a p-type or an n-type semiconductor layer) are stacked in this order, via a single layer or plural layers of a buffer layer, or the like, as appropriate.

The semiconductor layer has its one region removed in the thickness direction from the second semiconductor layer side, that is, the semiconductor layer is partially removed. At this region, the first semiconductor layer is exposed. On other region of the first semiconductor layer, i.e., except for the exposed region, the light emitting layer and the second semiconductor layer are stacked in order. The first semiconductor layer, the light emitting layer and the second semiconductor layer structuring the semiconductor layer are not particularly limited. For example, a nitride-based compound semiconductor such as $In_XAl_YGa_{1-X-Y}N$ ($0 \leq X$, $0 \leq Y$, $X+Y \leq 1$) or the like is suitably used. The layers forming the nitride semiconductor layer may each has a single-layer structure, or a stacked-layer structure or a superlattice structure of layers being different from one another in composition, thickness and the like. In particular, the light emitting layer preferably has a single quantum well structure or a multiple quantum well structure which is made of stacked layer of thin layers each can produce quantum effect.

The element substrate is not particularly limited. For example, it may be an element substrate usually used for growing a nitride semiconductor layer. Particularly, a light-transmissive substrate is preferable. In the present specification, the term "light-transmissive" refers to the capability to transmit light emitted from the light emitting element by about 60%, 65%, 70%, 80% or more. The element substrate may be made of sapphire, spinel, NGO, $LiAlO_2$, $LiGaO_3$, GaN or the like. Of those, an element substrate made of an oxide is preferable. An element substrate made of a wurtzite type crystal is more preferable, and particularly sapphire is further preferable.

The pair of electrodes included in the light emitting element are arranged on a same surface side of the semiconductor layer. The pair of electrodes may each have a single-layer structure or a stacked-layer structure, so long as they can be ohmically connected to the above-described first semiconductor layer and the second semiconductor layer, respectively, with a linear or substantially linear current-voltage relationship. Such electrodes can be formed using a material (e.g., Au, Pt, Pd, Rh, Ni, W, Mo, Cr, Ti or the like) and a structure known in the art, with an appropriate thickness. For example, a thickness of about several tens of micrometers to about three hundred micrometers is preferable.

Particularly, as will be described below, in the case where the pair of electrodes of the light emitting element are respectively electrically connected to the lead portions via bonding members, it is preferable to arrange a reflective layer (a plating film, a DBR film) to each of the pair of electrodes as the layer proximate to the semiconductor layer.

Wire

Each wire is an electrically conductive member electrically connecting the electrically conductive member and the light emitting element, and contains gold and silver. As shown in FIG. 1C, each wire includes a ball portion 32 connected to the corresponding electrode of the light emitting element, and a recrystallized region 34 immediately above the ball portion 32. Note that, though the ball portion is also the portion that is recrystallized by being molten, the portion except for the ball portion and extending from the ball portion is referred to as the recrystallized region herein.

The ball portion 32 is formed such that the tip of the wire inserted into an insertion hole of a capillary is molten by electric discharge or the like to form a ball (an initial ball), then, the ball is press-bonded and connected to the electrode of the light emitting element.

The recrystallized region 34 is the region where the property is altered by heat of the electric discharge in forming the ball, and is coarsened than the region not affected by heat (a normal region). The recrystallized region is susceptible to stress as compared to the normal region, and relieving the stress on the recrystallized region can reduce the occurrence of breakage of the wire. In the present embodiment, the length of the recrystallized region is set to about 50 µm to about 90 µm, and the height of the sealing member sealing the surrounding region (the minimum distance from the top of the ball portion to the upper surface of the sealing member, which is also referred to as "D" in FIG. 1C) is set to about 90 µm to about 230 µm. With this arrangement, the stress on the wire can be reduced, and thus the wire becomes less liable to break.

The length of the recrystallized region is preferably about 50 µm to about 90 µm. The length of the recrystallized region can be set to within this range by adjusting the ratio between gold and silver that are the main components of the wire, and the amount of other metal or additive. Alternatively, by adjusting the formation condition of the initial ball, the length of the recrystallized region can be set to within this range.

In order to obtain the recrystallized region within the above-noted range, for example, the content of gold that is the main component of the gold-silver alloy wire is preferably in a range of about 15 mass % to about 25 mass %.

Further, the wire may contain Cu, Pt, Al, Ca, Zn, Si, Ni, Pd, Ti or the like. Also, as the discharge condition, voltage or discharge period can be changed. For example, in the case of a wire having a diameter of 25 μm, by setting the diameter of the initial ball to about twice as great as the diameter of the wire, the recrystallized region can be set to about 50 μm to about 90 μm.

The optical output can be increased by reducing the proportion of gold and increasing the proportion of silver. For example, the gold in the gold-silver alloy wire can be in a range of about 2 mass % to about 15 mass %. In the case of using a gold-slyer alloy wire of such a proportion, the recrystallized region can be set in a range of about 80 μm to about 150 μm.

By setting the recrystallized region to have the length within this range, the loop height of the wire (the distance from the top of the ball portion to the highest position of the wire, which is also referred to as "H" in FIG. 1C) can be set to about 70 μm to about 150 μm.

The wire has, in addition to the ball portion and the recrystallized region described above, a portion bent at a position extending further from the recrystallized region (a bent portion), a substantially linear portion (a linear portion), a connecting portion connected to the electrically conductive member or an electrode of the adjacent light emitting element, and the like. The bent portion may be provided by one in number, or two or more in number.

The diameter of the wire is preferably about 18 μm to about 30 μm.

The coefficient of linear expansion of the wire is preferably about $14.2 \times 10^{-6}$ to about $19.7 \times 10^{-6}$, and further preferably about $17.6 \times 10^{-6}$ to about $18.9 \times 10^{-6}$.

Sealing Member

The sealing member is to protect the electronic components such as the light emitting element, the protective element, the wire and the like from dust, moisture, external force and the like. The sealing member includes resin as its main constituent member. The sealing member is greater in coefficient of linear expansion than the included electronic components described above. Accordingly, during manufacture of the light emitting device, or in the operation of the light emitting device, the stress due to contraction of the sealing member caused by the heat generated during energization or the like has a large influence on the electronic components included in the sealing member. Particularly, the stress on the wires tends to become great, so that in the present embodiment, the thickness of the sealing member around the wire is set within a particular range to relieve the stress on the wire. In more detail, the distance from the top of the ball portion of the wire to the upper surface of the sealing member (the minimum distance) is set to about 90 μm to about 230 μm. The recrystallized region formed on the ball portion generally has different characteristics than the normal region. The boundary between the regions tends to be damaged by the influenced of the stress. Accordingly, by reducing the amount of the sealing member around the wire, the influence of stress can be reduced, so that damage (breakage) of the wire can be reduced.

The sealing member can be formed by potting, dripping, printing, spraying, transfer molding or the like. By adjusting the supply amount of the sealing member, the height from the top of the ball portion of the wire can be adjusted to within the range described above. The upper surface of the sealing member may be flat surface or concaved surface.

In the case of forming the sealing member by potting, the volume of the sealing resin decreases by curing, resulting in a concave upper surface. For this reason, it is preferable to arrange the highest portion of the wire loop at a location that does not correspond to the lowest portion of the upper surface. The highest portion of the wire locates directly above the recrystallized region, so that it is preferable that the recrystallized region is also arranged at a location that does not correspond to the lowest portion of the concave surface. Thus, while reducing the effect of stress in the wire, the wire can be prevented from protruding out from the upper surface of the sealing member. The depth of the concave surface of the sealing member (i.e., the distance of the concave portion from an upper edge of the recess of the resin member) is preferably in a range of about 5 to 50 μm. With the arrangement described above, the light extracting efficiency can be improved.

The material of the sealing member preferably has light-transmissivity that allows the light from the light emitting element transmitting therethrough, and also exhibits light-fastness. Further, the coefficient of linear expansion of the material is preferably in a range of about $3 \times 10^{-6}$ to about $350 \times 10^{-6}$. Examples of the material include an insulating resin composition having light-transmissivity that allows the light from the light emitting element transmitting therethrough, such as a silicone resin composition, a modified silicone resin composition, an epoxy resin composition, a modified epoxy resin composition, an acrylic resin composition or the like.

Further, a silicone resin, an epoxy resin, a urea resin, a fluororesin and a hybrid resin containing at least one of the foregoing resins can also be used. Still further, without being limited to such organic substances, an inorganic substance such as glass, silica sol or the like can also be employed. In addition to such materials, as desired, a coloring agent, a light diffusing agent, a light reflecting material, various fillers, a wavelength conversion member (a fluorescent material) and the like can be contained in such materials.

The fluorescent material may be, for example, an oxide-based fluorescent material, a sulfide-based fluorescent material, a nitride-based fluorescent material or the like. For example, in the case where a gallium nitride-based light emitting element to emit blue light is employed as the light emitting element, at least one or two or more types of fluorescent materials that absorb the blue light to emit light can be employed. The examples of such fluorescent materials include a YAG-based fluorescent material and a LAG-based fluorescent material to emit yellow to green light, a SiAlON-based fluorescent material (β-sialon) to emit green light, a SCASN fluorescent material, a CASN-based fluorescent material, a KSF-based fluorescent material ($K_2SiF_6$:Mn), a sulfide-based fluorescent material, and a nano fluorescent material to emit red light. Preferably, the content of these fluorescent materials in the sealing member is about 5 mass % to about 120 mass %. Particularly, in the case of using a KSF-based fluorescent material, the content in the sealing member is preferably in a range of about 20 mass % to about 100 mass %.

Resin Member

The electrically conductive member used for at least a pair of positive and negative electrodes may be integrally held by a resin member. Note that, the resin member and the electrically conductive member may also be collectively referred to as the "resin package".

The resin member holds the above-described electrically conductive member (the lead frame). The resin member is formed such that resin packages of a plurality of light emitting devices are formed in one lead frame. In one lead frame, one or a plurality of resin members are molded as blocks. The resin member as a block may be the resin member for one light emitting device. Alternatively, the resin member of one block may be the resin member for a plurality of light emitting devices.

The material used as the resin member may be a resin such as a thermosetting resin or a thermoplastic resin. Examples of the material include an epoxy resin composition, a modified epoxy resin composition, a silicone resin composition, a modified silicone resin composition, a silicone-modified epoxy resin, an epoxy-modified silicone resin composition, a polyimide resin composition, a modified polyimide resin composition, polyphthalamide (PPA), a polycarbonate resin, polyphenylene sulfide (PPS), liquid crystal polymer (LCP), an ABS resin, a phenolic resin, an acrylic resin, a PBT resin or the like.

Further, the resin member may contain a light reflecting material such as titanium oxide, silicon dioxide, zirconium dioxide, potassium titanate, alumina, aluminum nitride, zinc oxide, boron nitride, mullite or the like. With such a material, light from the light emitting element can be efficiently reflected. Particularly, the light reflecting material that can allow the resin material that contains the light reflecting material to have a reflectivity of 60% or more, more preferably 70%, 80%, or 90% or more to the light from the light emitting element is preferable. For example, in the case of using titanium oxide, the titanium oxide is preferably contained in a range of about 20 mass % to about 40 mass %, based on the total weight of the resin member. Further, a black-color material such as carbon black may be contained. The light reflecting material or the black-color material can be adjusted as appropriate by the resin molding method or the molding condition such as resin flowability, or by the characteristic such as reflectivity or mechanical strength.

The resin member is arranged between leads forming paired electrodes in one light emitting device, and molded such that the leads are separated as being insulated after singulation. Further, in the case where the light emitting device having a recess portion is formed, the molding resin is arranged between the leads and further provided as a sidewall. These preferably form one recess portion integrally with the leads.

Bonding Member

The light emitting element is fixed on the electrically conductive member or the resin member via the bonding member.

The bonding member may be an insulating material or an electrically conductive material. For example, the insulating material may be resin, and the electrically conductive material may be a eutectic material or solder. Preferable eutectic materials may be an alloy whose main components are Au and Sn, an alloy whose main components are Au and Si, and an alloy whose main components are Au and Ge. The solder may be an alloy whose main components are Ag, Cu, and Sn, an alloy whose main components are Cu and Sn, and an alloy whose main components are Bi and Sn.

The light emitting device may include a protective element such as a Zener diode or a diode bridge.

First Embodiment

Figure 1B:
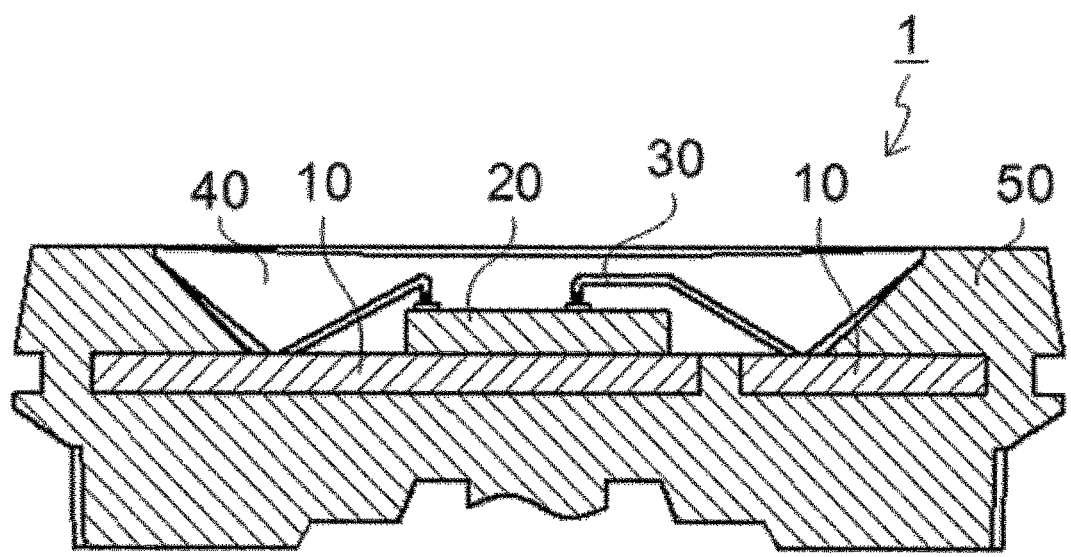
FIG. 1B is a schematic cross-sectional view showing the light emitting device of FIG. 1A.
Figure 1C:
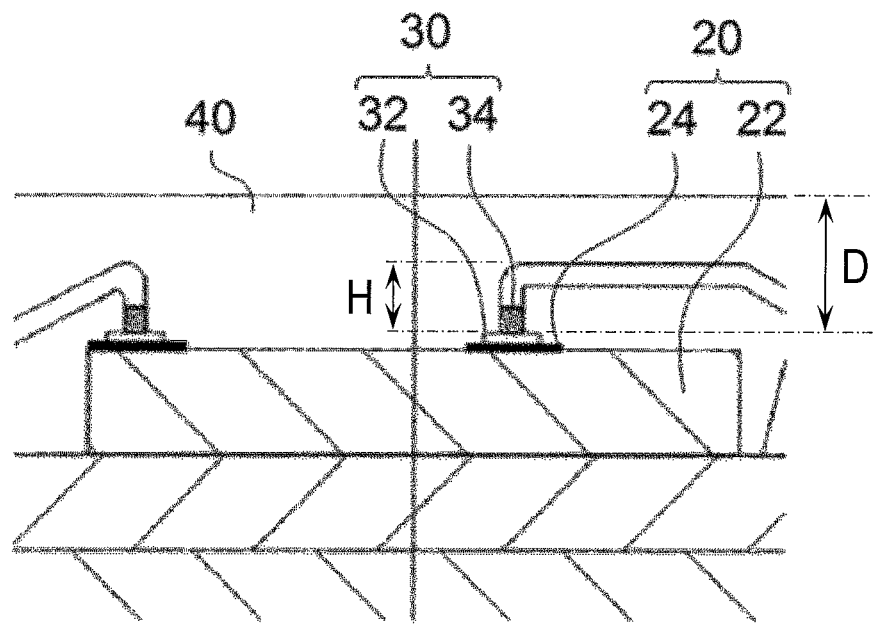
FIG. 1C is a schematic cross-sectional view showing the light emitting device of FIG. 1A.

FIGS. 1A, 1B, and 1C are each a schematic diagram exemplarily showing the structure of a light emitting device according to a first embodiment. FIG. 1A is a perspective view, FIG. 1B is a cross-sectional view, and FIG. 1C is a partial enlarged view of FIG. 1B.

As shown in FIG. 1A and others, the light emitting device 1 includes electrically conductive members 10, a light emitting element 20, wires containing gold and silver (gold-silver alloy wires) 30, and a sealing member 40.

The electrically conductive members 10 are provided by two in number for one light emitting device 1, so as to form paired positive and negative electrodes. On one electrically conductive member 10, the light emitting element 20 is placed, and further the wire is connected. To other electrically conductive member 10, other wire is connected. The paired electrically conductive members 10 are integrally retained by a resin member 50.

The resin package is structured by the resin member 50 and the paired electrically conductive members 10. The resin package has one recess portion at which the light emitting element 20 can be placed. At the bottom surface of the recess portion, the upper surfaces of the paired electrically conductive members 10 are exposed. On the exposed electrically conductive member, the light emitting element 20 is placed, and the wires 30 are connected thereto. The side surface of the recess portion is structured by the resin member 50.

The light emitting element 20 includes a semiconductor layer 22 and electrodes 24 formed on the upper surface of the semiconductor layer 22. In the first embodiment, at one recess portion provided to the resin package, one light emitting element 20 is placed. The light emitting element 20 includes a semiconductor layer in which a gallium nitride-based semiconductor layer is stacked on a sapphire substrate. The light emitting element 20 may have a thickness in a range of about 70 μm to about 200 μm, and a longitudinal side in a range of about 300 μm to about 1000 μm, and a lateral side in a range of about 100 μm to about 500 μm. The semiconductor layer is a gallium nitride-based semiconductor layer. The light emitting element 20 further includes a p-electrode formed by ITO provided on a p-type semiconductor layer and CrRh/CrPt/Au provided thereon, and an n-electrode formed by Al/CrPr/Pt/Au provided on an n-type semiconductor layer.

Each wire 30 includes a ball portion 32 connected to the electrode 24 of the light emitting element 20, and a recrystallized region 34 formed on the ball portion 32. The ball portion 32 has the width similar to the width (diameter) of the electrode of the light emitting element. When the width of the electrode of the light emitting element is 60 μm, the width (maximum width) of the ball portion is in a range of about 60 μm to about 85 μm. Further, the height of the ball portion 32 is about 50 μm. The recrystallized region 34 formed immediately above the ball portion 32 has a length of 50 μm to 90 μm, and further the wire 30 has a bent portion at a portion extending from the recrystallized region 34.

In the first embodiment, in the light emitting element 20, the position of the electrodes formed at the upper surface of the light emitting element is different between the p-electrode and the n-electrode. As shown in FIG. 1C, out of the two electrodes formed at the upper surface of the light emitting element 20, the right electrode (the p-electrode) is formed as spaced away from the end of the upper surface of the light emitting element 20. The left electrode (the n-electrode) is formed at the position nearer to the end of the light emitting element 20 as compared to the p-electrode. Since the electrodes are arranged in such a manner, the wires respectively connected to the p-electrode and the n-electrode are different in the loop shape.

In more detail, at each of the electrodes, the wire 30 to which the electrode is connected is provided with the recrystallized region 34 on the ball portion 32. However, the difference between the electrodes lies in the shape of the wire that extends via the bent portion formed at the portion extending from the recrystallized region 34. The wire connected to the right p-electrode extends substantially in the horizontal direction from the bent portion, and further is provided with another bent portion. By bending the wire at two portions in this manner, the height of the wire can be reduced. Thus, the amount of the sealing member 40 arranged below the wire can be reduced, and hence stress put on the wire can be reduced.

The sealing member 40 covers the light emitting element 20 and the wires 30. The sealing member 40 is packed in the recess portion of the resin package. It is preferable to pack the sealing member 40 to reach the upper end of the sidewall of the recess portion. The upper surface of the sealing member 40 may be flat as shown in FIG. 1B, or may be recessed. In each of the cases, preferably, the distance to the upper surface of the sealing member 40, in more detail the distance (D) from the top of the ball portion 32 of the wire 30 of the light emitting element 20 to the upper surface of the sealing member 40 is 90 µm to 230 µm.

Second Embodiment

Figure 2A:
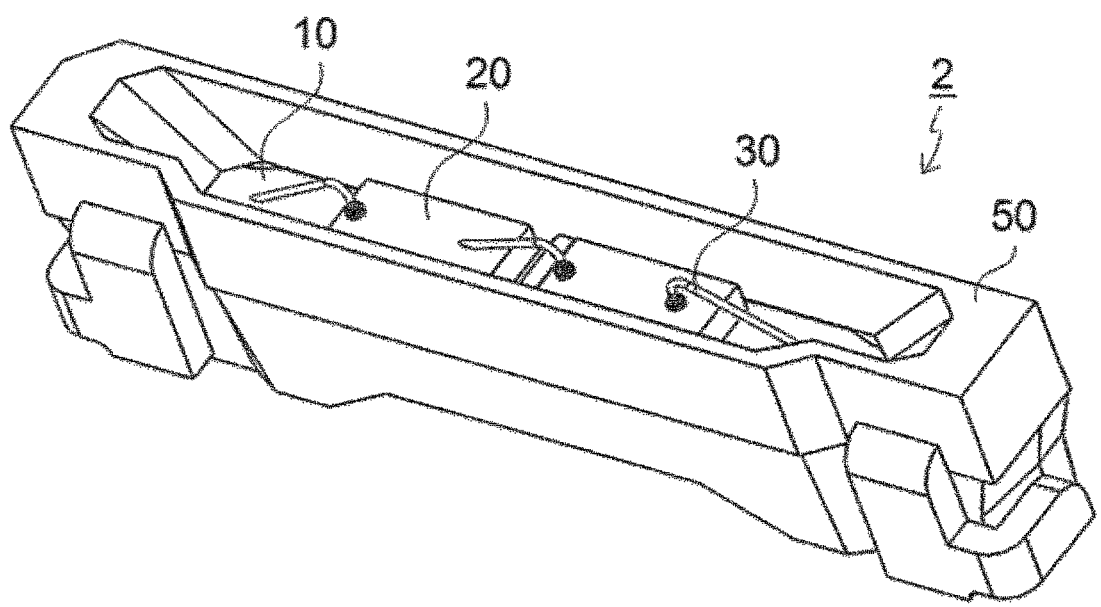
FIG. 2A is a schematic perspective view showing a light emitting device according to another embodiment.
Figure 2B:
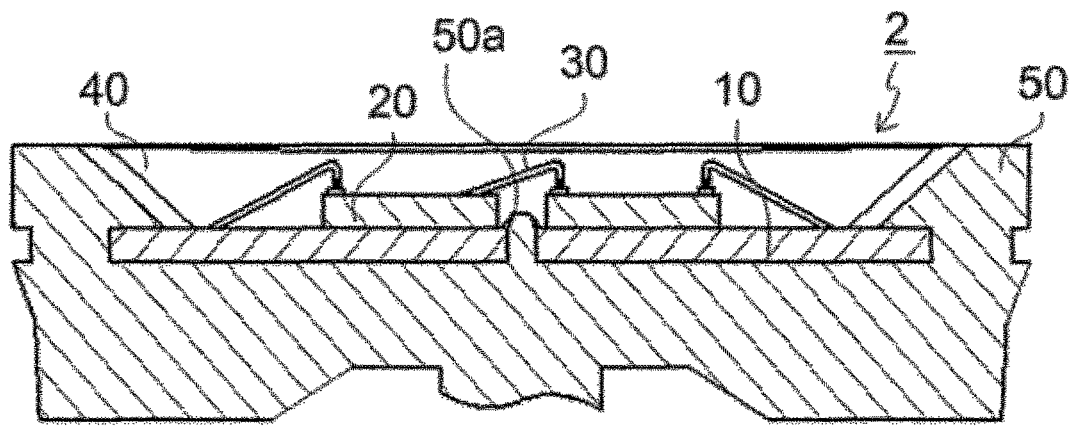
FIG. 2B is a schematic cross-sectional view showing the light emitting device of FIG. 2A.
Figure 2C:
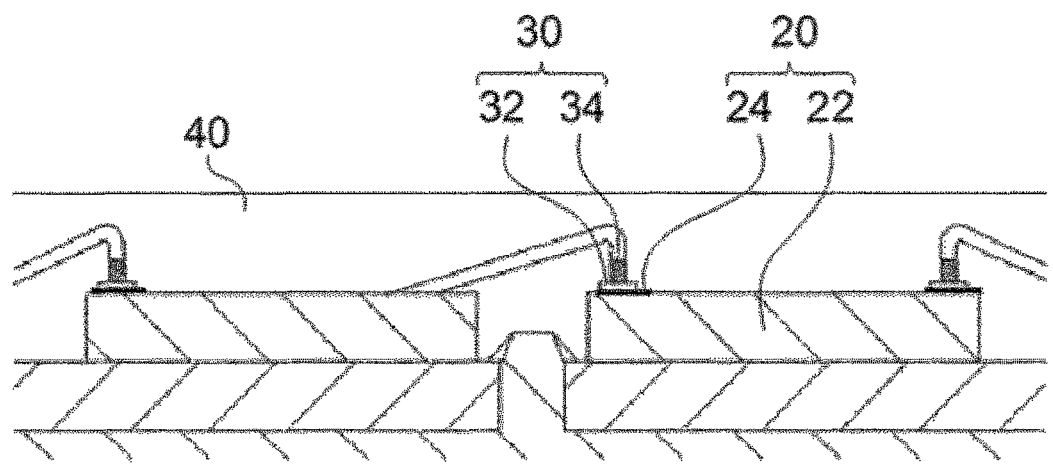
FIG. 2C is a schematic cross-sectional view showing the light emitting device of FIG. 2A.

FIGS. 2A, 2B, and 2C are each a schematic diagram exemplarily showing the structure of a light emitting device according to a second embodiment. FIG. 2A is a perspective view, FIG. 2B is a cross-sectional view, and FIG. 2C is a partial enlarged view of FIG. 2B. The second embodiment is different from the first embodiment in that one light emitting device 2 has one recess portion, and two light emitting elements 20 are mounted therein. Further, in the second embodiment, on each of two electrically conductive members 10, one light emitting element 20 is placed. The wires 30 connect the electrically conductive members 10 and the light emitting elements 20 to each other, and other wire 30 connects the light emitting elements to each other.

The light emitting elements 20 are respectively arranged on separate electrically conductive members 10. Accordingly, the wire 30 connecting the light emitting elements 20 to each other is arranged on the resin member 50 between the electrically conductive member 10 and the electrically conductive member 10. Here, the resin member 50 being the recess portion bottom surface of the package and arranged between the electrically conductive members 10 is provided with a projected portion 50a projecting further than the upper surfaces of the electrically conductive members 10. Provision of such a projected portion 50a makes it possible to reduce the amount of the sealing member 40, and therefore the stress put on the wire 30 can be reduced. The height of the projected portion 50a is preferably lower than the height of the light emitting elements 20, and being higher than half the height of the light emitting element 20. As shown in FIG. 2C, preferably, the projected portion 50a has inclined surfaces opposing to the light emitting elements 20 (i.e., the side surfaces). Thus, the side surfaces (the inclined surfaces) of the projected portion 50a can be used as reflective surfaces reflecting light from the light emitting element 20, whereby the light extracting efficiency can be improved.

The second embodiment is different from the first embodiment also in the arrangement of the electrodes 24 of each light emitting element 20. That is, the electrodes 24 formed at the upper surface of the light emitting element 20 are respectively formed in close proximity to the ends. By employing such light emitting elements 20, the ball portion 32 of each wire 30 is also formed in close proximity to the end of the upper surface of the light emitting element 20. Thus, each wire 30 can be shortened. The wire 30 connecting the light emitting elements 20 to each other is arranged so as to cross the center of the light emitting device 2 and therefore stress tends to be put thereon. Here, by shortening the wire 30, stress is not easily put on the wire 30, and breakage of the wire can be reduced.

A light emitting device according to an embodiment of the present invention includes a light emitting element having an electrode, an electrically conductive member, a wire electrically connecting the electrically conductive member and the light emitting element and containing gold and silver, and a sealing member covering the light emitting element and the wire. The wire includes a ball portion provided on the electrode of the light emitting element, and a recrystallized region having a length of about 50 µm to about 90 µm and provided on the ball portion. In the sealing member, the minimum distance from the top of the ball portion to the upper surface of the sealing member is about 90 µm to about 230 µm.

With the arrangement described above, a light emitting device in which breakage of a gold-silver alloy wire is reduced can be obtained.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
   an electrically conductive member;
   a light emitting element provided on the electrically conductive member and having an electrode, an uppermost surface of the electrode being made of gold;
   a wire containing gold and silver and connecting the electrically conductive member and the light emitting element, the wire does not contain palladium, the wire comprising:
      a ball portion provided on the electrode of the light emitting element; and
      a recrystallized region provided on the ball portion and having a length in a range of 50 µm to 90 µm; and
   a sealing member having a lower surface and an upper surface opposite to the lower surface and covering the light emitting element and the wire so that the lower surface faces the electrically conductive member and the light emitting element and so that a distance from a top of the ball portion to the upper surface of the sealing member is 90 µm to 230 µm,
   wherein the wire has a bent portion and a linear portion, and
   wherein the upper surface of the sealing member is a concaved surface.

2. The light emitting device according to claim 1, wherein the wire has a diameter in a range of 18 µm to 30 µm.

3. The light emitting device according to claim 1, wherein the wire has a loop height of 70 µm to 150 µm.

4. The light emitting device according to claim 1, wherein the wire includes gold in a range of 15 mass % to 25 mass %.

5. The light emitting device according to claim 1, wherein the wire includes gold in a range of 2 mass % to less than 15 mass %.

6. The light emitting device according to claim 1, wherein a coefficient of linear expansion of the sealing member is in a range of $3 \times 10^{-6}$ to $350 \times 10^{-6}$.

7. The light emitting device according to claim 1, wherein a main component of the sealing member is a silicone resin composition.

8. The light emitting device according to claim 1, wherein the recrystallized region of the wire is arranged avoiding a location corresponding to a lowest portion of the upper surface of the sealing member.

9. The light emitting device according to claim 1,
wherein the sealing member contains a fluorescent material, and
wherein the fluorescent material includes a KSF-based fluorescent material.

* * * * *